US012602528B2

(12) United States Patent
Poornachandran et al.

(10) Patent No.: US 12,602,528 B2
(45) Date of Patent: Apr. 14, 2026

(54) APPARATUS, DEVICE, METHOD, AND COMPUTER PROGRAM FOR GENERATING LOGIC TO BE PERFORMED BY COMPUTING CIRCUITRY OF A COMPUTING ARCHITECTURE

(71) Applicant: Altera Corp., San Jose, CA (US)

(72) Inventors: Rajesh Poornachandran, Portland, OR (US); Michael Kinsner, Halifax (CA); John Freeman, Waterloo (CA); Joseph Garvey, Toronto (CA); Artem Radzikhovskyy, Victoria (CA)

(73) Assignee: Altera Corporation, San Jose, CA (US)

( * ) Notice: Subject to any disclaimer, the term of this patent is extended or adjusted under 35 U.S.C. 154(b) by 776 days.

(21) Appl. No.: 17/809,293

(22) Filed: Jun. 28, 2022

(65) Prior Publication Data

US 2022/0327267 A1 Oct. 13, 2022

(51) Int. Cl.
| | |
|---|---|
| *G06F 30/30* | (2020.01) |
| *G06F 1/08* | (2006.01) |
| *G06F 30/323* | (2020.01) |
| *G06F 30/327* | (2020.01) |

(Continued)

(52) U.S. Cl.
CPC .............. *G06F 30/327* (2020.01); *G06F 1/08* (2013.01); *G06F 30/323* (2020.01); *G06F 30/3312* (2020.01); *G06F 30/34* (2020.01)

(58) Field of Classification Search
None
See application file for complete search history.

(56) References Cited

U.S. PATENT DOCUMENTS

| | | | | |
|---|---|---|---|---|
| 7,895,416 B2 * | 2/2011 | Smith | .............. | H03K 19/17752 |
| | | | | 712/220 |
| 9,922,150 B1 * | 3/2018 | Yiannacouras | ....... | G06F 30/392 |
| 10,002,063 B2 * | 6/2018 | Das | ...................... | G06F 11/348 |

(Continued)

*Primary Examiner* — Leigh M Garbowski
(74) *Attorney, Agent, or Firm* — 2SPL Patent Attorneys PartG mbB; Yong Beom Hwang

(57) ABSTRACT

Examples relate to an apparatus, device, method, and computer program for generating logic to be performed by computing circuitry of a computing architecture. The apparatus is configured to determine a performance-critical compute path of a compute kernel to be executed on a plurality of units of computing circuitry of a computing architecture, the compute kernel comprising a plurality of interdependent groups of computational instructions, with the performance-critical compute path being based on a subset of the interdependent groups of computational instructions. The apparatus is configured to determine, for at least one group of computational instructions outside the performance-critical compute path, a reduced clock frequency being lower than a maximally feasible clock frequency of the respective group of computational instructions. The apparatus is configured to generate logic to be performed by one or more of the plurality of separately controllable units of computing circuitry based on the compute kernel, wherein a portion of the logic that is generated to be performed by the plurality of separately controllable units of computing circuitry outside the performance-critical compute path is generated based at least in part on the reduced clock frequency.

24 Claims, 4 Drawing Sheets

(51) Int. Cl.
    *G06F 30/3312*     (2020.01)
    *G06F 30/34*     (2020.01)

(56)         References Cited

U.S. PATENT DOCUMENTS

| | | | |
|---|---|---|---|
| 10,033,387 B2 * | 7/2018 | Chen | H04L 49/10 |
| 10,216,217 B1 * | 2/2019 | Santan | G06F 1/08 |
| 10,366,189 B2 * | 7/2019 | Chen | G06F 30/394 |
| 10,587,271 B2 * | 3/2020 | Wang | H03K 19/1774 |
| 11,171,652 B2 * | 11/2021 | Chen | H03K 19/017581 |
| 11,520,371 B2 * | 12/2022 | Gu | G06F 9/5027 |
| 12,353,238 B2 * | 7/2025 | Subbareddy | G06F 1/3243 |

* cited by examiner

COMPUTER SYSTEM

| MEMORY CIRCUITRY | STORAGE CIRCUITRY |
| --- | --- |

16

18

PROCESSING CIRCUITRY

14

INTERFACE CIRCUITRY

12

10

100

COMPUTING ARCHITECTURE
(E.G. FPGA)

20

22

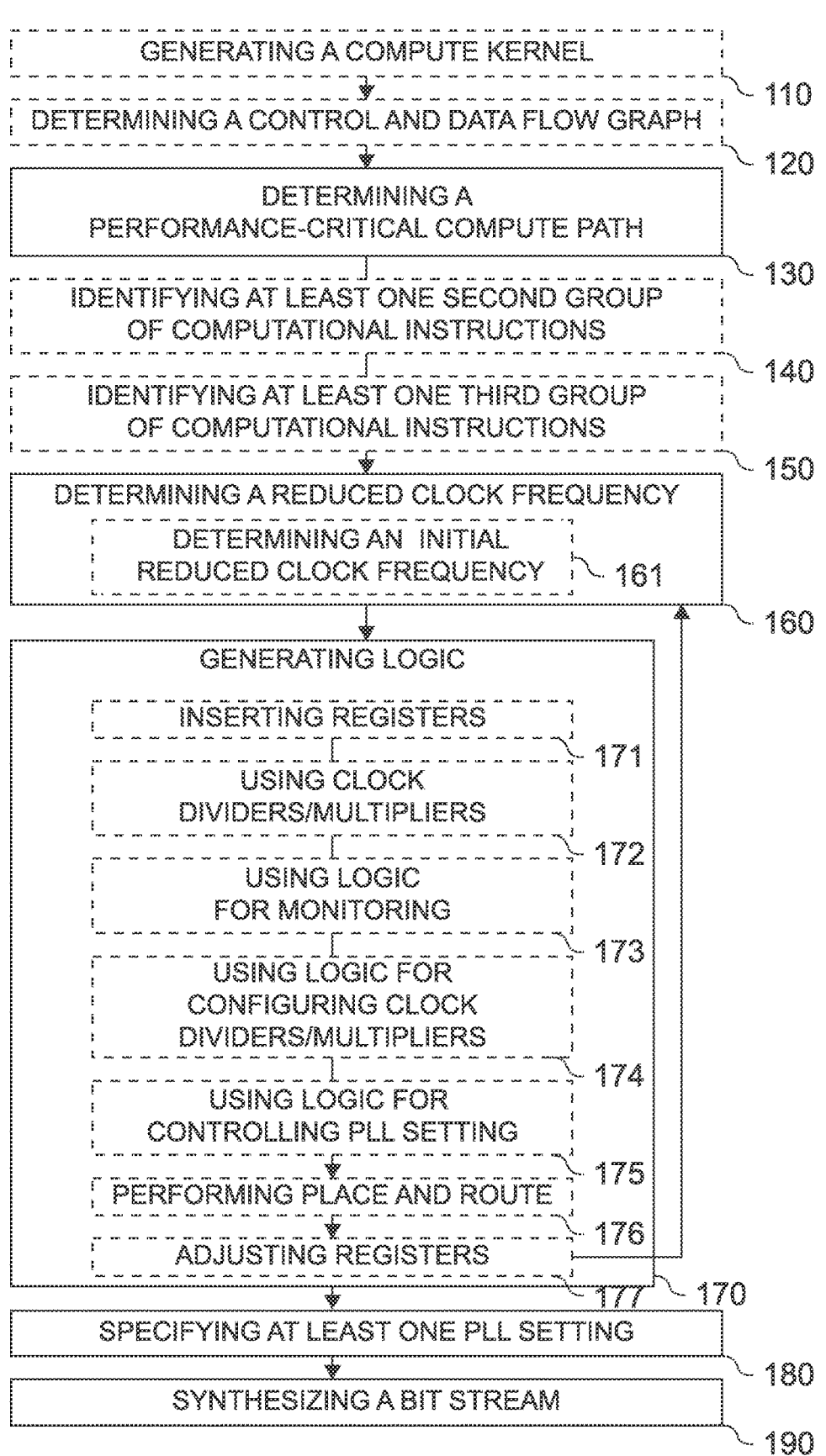

GENERATING A COMPUTE KERNEL — 110

DETERMINING A CONTROL AND DATA FLOW GRAPH — 120

DETERMINING A
PERFORMANCE-CRITICAL COMPUTE PATH — 130

IDENTIFYING AT LEAST ONE SECOND GROUP
OF COMPUTATIONAL INSTRUCTIONS — 140

IDENTIFYING AT LEAST ONE THIRD GROUP
OF COMPUTATIONAL INSTRUCTIONS — 150

DETERMINING A REDUCED CLOCK FREQUENCY

DETERMINING AN INITIAL
REDUCED CLOCK FREQUENCY — 161

— 160

GENERATING LOGIC

INSERTING REGISTERS — 171

USING CLOCK
DIVIDERS/MULTIPLIERS — 172

USING LOGIC
FOR MONITORING — 173

USING LOGIC FOR
CONFIGURING CLOCK
DIVIDERS/MULTIPLIERS — 174

USING LOGIC FOR
CONTROLLING PLL SETTING — 175

PERFORMING PLACE AND ROUTE — 176

ADJUSTING REGISTERS — 177

— 170

SPECIFYING AT LEAST ONE PLL SETTING — 180

SYNTHESIZING A BIT STREAM — 190

Fig. 1b

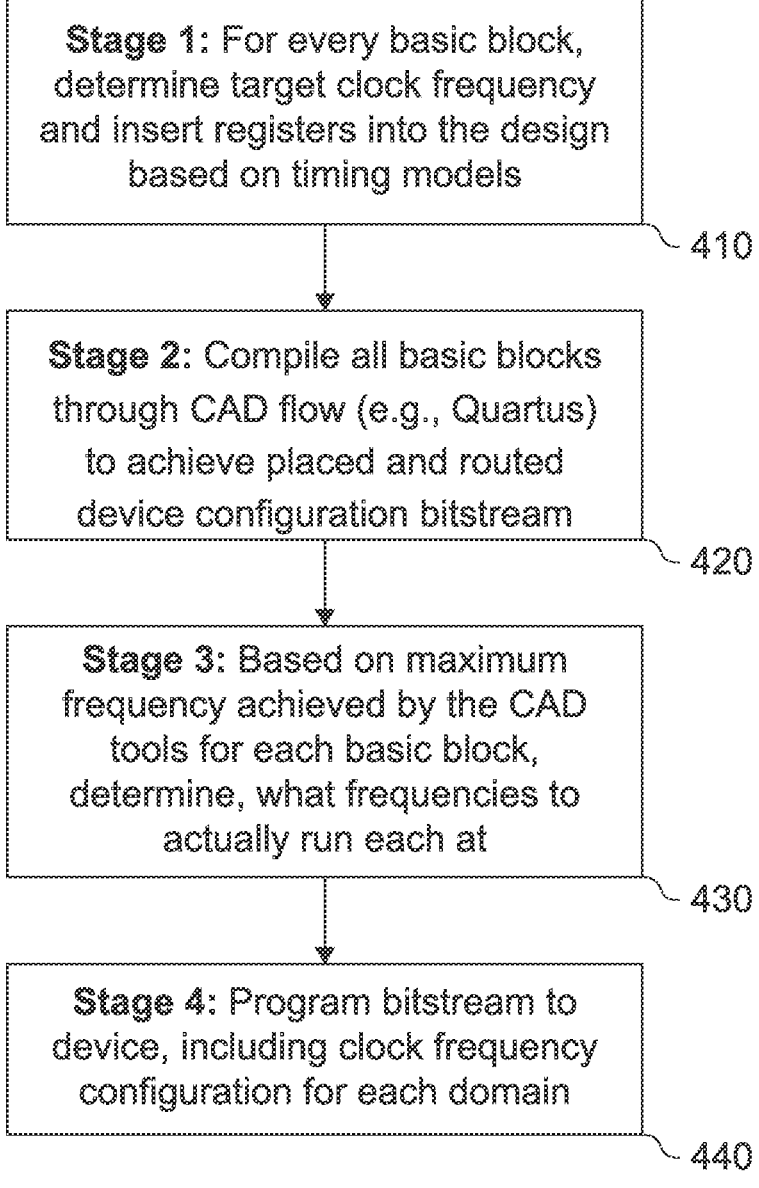

Stage 1: For every basic block, determine target clock frequency and insert registers into the design based on timing models — 410

Stage 2: Compile all basic blocks through CAD flow (e.g., Quartus) to achieve placed and routed device configuration bitstream — 420

Stage 3: Based on maximum frequency achieved by the CAD tools for each basic block, determine, what frequencies to actually run each at — 430

Stage 4: Program bitstream to device, including clock frequency configuration for each domain — 440

Fig. 4

APPARATUS, DEVICE, METHOD, AND COMPUTER PROGRAM FOR GENERATING LOGIC TO BE PERFORMED BY COMPUTING CIRCUITRY OF A COMPUTING ARCHITECTURE

FIELD

Examples relate to an apparatus, device, method, and computer program for generating logic to be performed by computing circuitry of a computing architecture.

BACKGROUND

Spatial architectures, such as Field-Programmable Gate Arrays (FPGAs), can implement and execute programs by mapping parts of the program code to different regions of a spatial hardware device. Reducing or minimizing power consumption may be a key objectives for many applications, particularly in embedded and edge deployments, and is significantly impacted by the digital clock speeds driving the logic.

Typical high level compiler implementations (e.g., compilation to hardware from C++, OpenCL (Open Computing Language), or SYCL) drive the logic of the computational kernels or sets of kernels comprising up to the full application, with a single clock frequency, which may be considered suboptimal both at the system level as well as the kernel level. The clock frequency is typically chosen to maximize performance of the bottleneck region of the compute, with all non-bottleneck regions paying both power and resource utilization costs that can lead to suboptimal system performance.

Such homogenous clock selection or clock scaling may optimize for overall performance at the tradeoff of power saving and is generally not cognizant of application use of the logic elements. Additionally, many of today's designs do not factor in the appropriate clocking for the shared resources across kernels in terms of memory and interconnect. This may lead to a less than efficient tradeoff between performance and power and to an opaque mapping between logic elements and the application being performed, and thus a sub-optimal or underappreciated hardware, less than ideal user experience and reduced performance per watt.

BRIEF DESCRIPTION OF THE FIGURES

Some examples of apparatuses and/or methods will be described in the following by way of example only, and with reference to the accompanying figures, in which

FIG. 1b shows a flow chart of an example of a method for generating logic for a computing architecture;

FIG. 4 shows a schematic diagram of a four-stage approach to determining clock frequencies and programming computing circuitry.

DETAILED DESCRIPTION

Figure 1A:
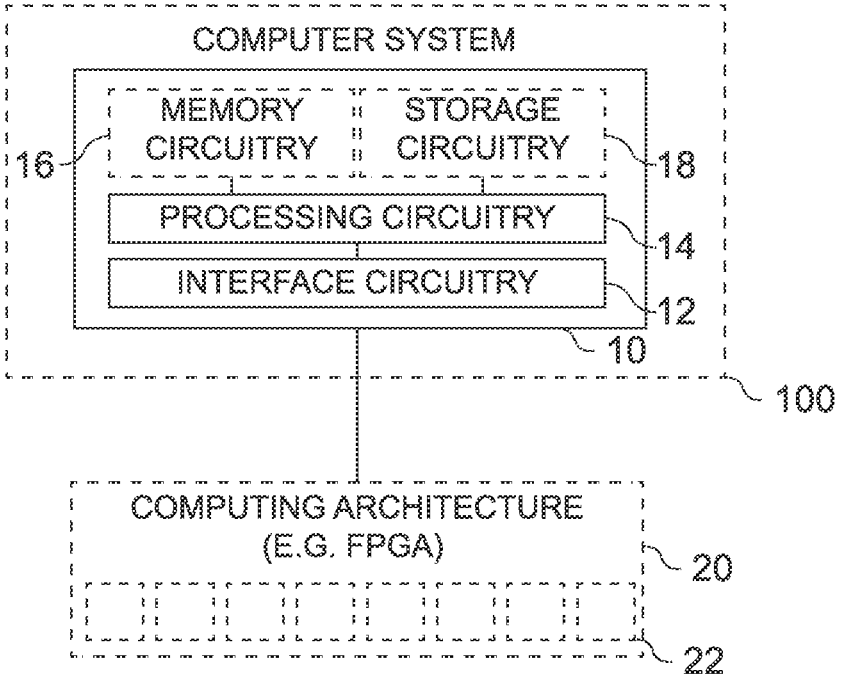
FIG. 1a shows a schematic diagram of an example of an apparatus or device for generating logic for a computing architecture and of a computer system comprising such an apparatus or device.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

In the following description, specific details are set forth, but examples of the technologies described herein may be practiced without these specific details. Well-known circuits, structures, and techniques have not been shown in detail to avoid obscuring an understanding of this description. "An example/example," "various examples/examples," "some examples/examples," and the like may include features, structures, or characteristics, but not every example necessarily includes the particular features, structures, or characteristics.

Some examples may have some, all, or none of the features described for other examples. "First," "second," "third," and the like describe a common element and indicate different instances of like elements being referred to. Such adjectives do not imply element item so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact.

As used herein, the terms "operating", "executing", or "running" as they pertain to software or firmware in relation to a system, device, platform, or resource are used interchangeably and can refer to software or firmware stored in one or more computer-readable storage media accessible by the system, device, platform, or resource, even though the instructions contained in the software or firmware are not actively being executed by the system, device, platform, or resource.

The description may use the phrases "in an example/example," "in examples/examples," "in some examples/examples," and/or "in various examples/examples," each of which may refer to one or more of the same or different examples. Furthermore, the terms "comprising," "including," "having," and the like, as used with respect to examples of the present disclosure, are synonymous.

Various examples of the present disclosure relate to a concept for heterogeneous frequency matching, e.g., of a control flow program decomposition, for power and performance optimization, e.g., through compiler analysis and device telemetry in spatial architectures.

Various examples of the present disclosure are based on the finding, that some computing architectures allow for the concurrent use of different clock domains, such that some of the logic operates with higher clock frequencies and some other logic operates with lower clock frequencies. Such computing architectures are in the following referred to as non-timing-closed (i.e., allowing for multiple different clock frequencies) spatial (i.e., having spatially separated computing circuitry that can be controlled independently of each other) architectures. One prominent example of such non-timing-closed spatial architectures are Field-Programmable Gate Arrays (FPGAs). However, the concept is not limited to FPGAs. The concurrent use of different clock domains can also be supported by other computing architectures, such as other types of programmable hardware devices or Graphics Processing Units that support the concurrent operation of different computation units (CUs) with different clock speeds. On non-timing-closed spatial architectures (such as FPGAs), different kernels and parts of single kernels can be implemented to execute at different clock frequencies. This can provide power and resource consumption (e.g., through pipeline register minimization) advantages over a unified clocking strategy. A FPGA high level design with an incorporated heterogeneous clocking approach may provide improved resource utilization and power consumption metrics without system-level performance degradation. This disclosure proposes automated high-level design (e.g., from C++, OpenCL, or SYCL) compiler techniques that enable a heterogeneous clocking strategy, without any user intervention, resulting in competitive differentiation on spatial architecture power consumption and resource utilization metrics.

FIG. 1a shows a schematic diagram of an example of an apparatus 10 or device 10 for generating logic for a computing architecture. The apparatus 10 comprises circuitry that is configured to provide the functionality of the apparatus 10. For example, the apparatus 10 of FIGS. 1a and 1b comprises (optional) interface circuitry 12, processing circuitry 14, memory circuitry 16 and (optional) storage circuitry 18. For example, the processing circuitry 14 may be coupled with the interface circuitry 12, with the memory circuitry 16 and with the storage circuitry 18. For example, the processing circuitry 14 may be configured to provide the functionality of the apparatus 10, in conjunction with the interface circuitry 12 (for exchanging information, e.g., with other components of the computer system or outside the computer system, such as computing circuitry 22 of a computing architecture 20), the memory circuitry 16 (for temporarily storing information, such as machine-readable instructions) and the storage circuitry 18 (for permanently or semi-permanently storing information, such as the machine-readable instructions). Likewise, the device 10 may comprise means that is/are configured to provide the functionality of the device 10. The components of the device 10 are defined as component means, which may correspond to, or implemented by, the respective structural components of the apparatus 10. For example, the device 10 of FIGS. 1a and 1b comprises means for processing 14, which may correspond to or be implemented by the processing circuitry 14, (optional) means for communicating 12, which may correspond to or be implemented by the interface circuitry 12, memory 16, which may correspond to or be implemented by the memory circuitry 16 and (optional) means for storing information (i.e., storage) 18, which may correspond to or be implemented by the storage circuitry 18. In general, the functionality of the processing circuitry 14 or means for processing 14 may be implemented by the processing circuitry 14 or means for processing 14 executing machine-readable instructions. Accordingly, any feature ascribed to the processing circuitry 14 or means for processing 14 may be defined by one or more instructions of a plurality of machine-readable instructions. The apparatus 10 or device 10 may comprise the plurality of machine-readable instructions, e.g., within the memory circuitry 16 or memory 16 or within the storage circuitry 18 or means for storing information 18.

The processing circuitry 14 or means for processing 14 is configured to determine a performance-critical compute path of a compute kernel to be executed on a plurality of units of computing circuitry 22 of the computing architecture 20. The compute kernel comprises a plurality of interdependent groups of computational instructions, with the performance-critical compute path being based on a subset of the interdependent groups of computational instructions. The processing circuitry 14 or means for processing 14 is configured to determine, for at least one group of computational instructions outside the performance-critical compute path, a reduced clock frequency being lower than a maximally feasible clock frequency of the respective group of computational instructions. The processing circuitry 14 or means for processing 14 is configured to generate logic to be performed by one or more of the plurality of separately controllable units of computing circuitry based on the compute kernel. A portion of the logic that is generated to be performed by the plurality of separately controllable units of computing circuitry outside the performance-critical compute path is generated based at least in part on the reduced clock frequency.

FIG. 1a further shows an example of a computer system 100 comprising the apparatus 10 or device 10. In some examples, the computer system 100 may further comprise the computing architecture 20. Alternatively, as shown in FIG. 1a, the computing architecture 20 may be separate from the computer system.

FIG. 1b shows a flow chart of an example of a corresponding (computer-implemented) method for generating the logic for the computing architecture. The method comprises determining 130 the performance-critical compute path of a compute kernel to be executed on the plurality of units of computing circuitry of the computing architecture. The method comprises determining 160, for at least one group of computational instructions outside the performance-critical compute path, the reduced clock frequency being lower than a maximally feasible clock frequency of the respective group of computational instructions. The method comprises generating 170 the logic to be performed by one or more of the plurality of separately controllable units of computing circuitry based on the compute kernel. The portion of the logic that is generated to be performed by the plurality of separately controllable units of computing circuitry outside the performance-critical compute path is generated based at least in part on the reduced clock frequency.

In the following, the functionality of the apparatus 10, the device 10, the method and of a corresponding computer program is illustrated with respect to the apparatus 10.

Features introduced in connection with the apparatus 10 may likewise be included in the corresponding device 10, method and computer program.

The proposed concept is based on the finding, that many computer programs, and thus also compute kernels, which are based on a computer program (or a part thereof), comprise some measure of concurrent execution of logic. For example, a first portion of the compute kernel might be tasked with performing an arithmetic calculation, while a second portion of the compute kernel might be tasked with calculating addresses where the result of the arithmetic calculation is to be stored (or new data to be processed by the arithmetic calculation) is to be loaded from. It is evident, that one of these tasks may involve a larger number of computations, or more generally longer duration of computation (as some computations require more clock cycles than others) than the other. If both tasks are performed with the same clock speed (assuming, for the sake of simplicity, that each instruction takes one clock cycle to execute), one task may finish ahead of the other task. However, the faster some computing circuitry is operated, the more energy it usually consumes, and the more additional hardware resources may be required, as the operation of computing circuitry at higher clock frequencies often requires some amount of pipelining, which requires the inclusion of additional (memory) registers for storing signals between the stages of the pipeline. Therefore, in the proposed concept, some portions of the compute kernel are identified that do not have to be performed with maximal clock frequency, but with a lower clock frequency that may be sufficiently high to not delay the performance of the other tasks.

In the context of the present disclosure, compute kernels include computational instructions that are to be executed by the computing circuitry of the computing architecture. Compute kernels may be used as part of a larger computer program, and may be used for performing computationally expensive tasks on a processing unit that is particularly suitable for such computations, such as an FPGA, a GPU, a machine-learning accelerator etc. Accordingly, a compute kernel may be a portion of a computer program that is offloaded to an accelerator processing unit, with the computing architecture comprising the accelerator processing unit. In the case of the computing architecture being an FPGA, these computational instructions are transformed into logic (i.e., logic instructions) that can be mapped to the configurable logic elements (i.e., logic tiles) of the FPGA. In effect, the configurable logic elements of the FPGA are programmed such, that they execute the computational instructions of the compute kernel. Accordingly, the plurality of units of computing circuitry of the computing architecture may comprise a plurality of logic tiles (also denoted logic blocks or logic elements) of the field-programmable gate array, with the plurality of logic tiles being operable at different clock frequencies. In this case, the logic may be generated such, that logic tiles used for executing the at least one group of computational instructions outside the performance-critical compute path are operated based on the reduced clock frequency. In FPGAs, such logic tiles may be implemented using Look-up-Table (LUT) circuitry, with the LUT circuitry defining the functionality of the respective logic tile. For example, the LUT circuitry may define the output to be provided by the LUT circuitry for a given input or set of inputs. Consequently, the FPGA may comprise a plurality of LUTs (implemented by the LUT circuitry), which are programmable by the logic generated herein. However, as outlined above, the proposed concept is not limited to FPGAs, but can be applied to any kind of computing architecture with multiple units of computing circuitry (such as the logic tiles of the FPGA) that can be operated at different clock frequencies. In other words, the computing architecture may be a computing architecture that comprises a plurality of units of computing circuitry, with the plurality of units of computing circuitry being operable at different clock frequencies. Accordingly, the plurality of units of computing circuitry may be separately controllable at least with respect to a clock frequency being used to operate the respective unit of computing circuitry.

To determine the portions of the compute kernel that can be executed with a lower clock frequency, the proposed concept identifies the opposite—the portions of the compute kernel that are to be executed with a maximal clock frequency, as lower clock frequencies would slow down the overall performance of the compute kernel. These portions of the compute kernel are denoted the performance-critical compute path of the compute kernel. The performance-critical compute path thus comprises the performance-critical instructions of the compute kernel, i.e., the instructions of the compute kernel that cannot be executed more slowly (or differently) without impacting the overall performance of the compute kernel, e.g., with respect to latency, throughput and/or power consumption. In other words, the performance of the performance-critical compute path and/or of the overall compute kernel may relate to at least one of a latency, a throughput, and a power consumption of the compute kernel. Accordingly, the performance-critical compute path may be a time-critical (or latency-critical) compute path, a throughput-critical compute path or a power-consumption-critical compute path (or a combination thereof). As outlined above, this performance-critical compute path is based on a subset of the interdependent groups of computational instructions, with other groups of computational instructions outside the subset being outside the performance-critical compute path. In various examples of the present disclosure, the performance-critical compute path may be determined based on a so-called control and data flow graph (CDFG) of the compute kernel.

Compute kernels (also denoted "accelerator program entry point units of computation") that are compiled to a spatial architecture (i.e., a computing architecture having a plurality of units of computing circuitry that can be controlled independently) can generally be decomposed into such a control and data flow graph, which represents the flow of both data and any control dependencies such as ordering requirements between instructions extracted from the source code (of the compute kernel, or of a computer program comprising the compute kernel). In general, such a compute kernel may be obtained by compiling the compute kernel from a source code, with the compilation targeting the specific computing architecture. For example, the processing circuitry may be configured to generate the compute kernel by compiling code of a high-level programming language (such as SYCL, OpenCL or C++). Accordingly, as further shown in FIG. 1b, the method may comprise generating 110 the compute kernel by compiling the code of the high-level programming language. A byproduct of this compilation can be the aforementioned CDFG, which may be derived from the compiled compute kernel (or be generated during compilation of the compute kernel). Vertices of the control and data flow graph may represent the computational instructions and edges of the control and data flow graph may represent the interdependence (i.e., the data flow interdependence and/or the control flow interdependence) between the computational instructions. In some examples, the processing circuitry may be configured to generate the control and data flow graph based on the compute kernel (e.g., as a byproduct of the compilation, or based on the compiled compute path). Accordingly, as further shown in FIG. 1*b*, the method may comprise generating 120 the control and data flow graph based on the compute kernel.

Figures 2, 3:
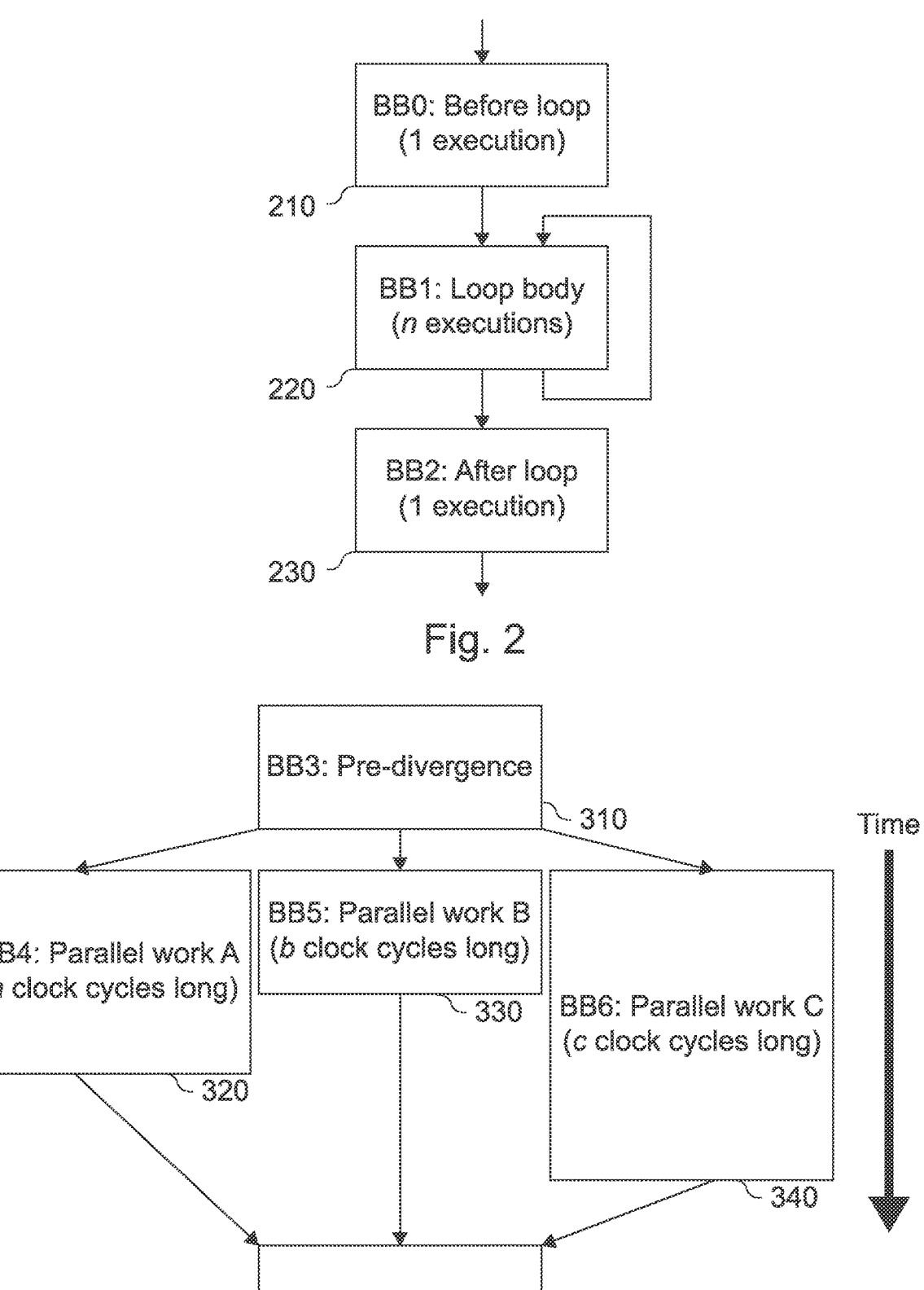
FIG. 2 shows a schematic diagram of an example of a control flow decomposition of a computer program.
FIG. 3 shows a schematic diagram of an example of parallel work nodes in a control and data flow graph.

This CDFG may now be used to determine the performance-critical compute path. In other words, the processing circuitry may be configured to determine the performance-critical compute path of the compute kernel based on the control and data flow graph of the compute kernel. CDFGs can contain varying levels of program decomposition. For brevity, in this summary, basic blocks are being referred to, which are a fundamental structure in the control flow graph of common compiler frameworks. In general, a basic block has a single control flow entry and single control flow exit point. The proposed concept applies more broadly to arbitrary decompositions of structure within a CDFG (e.g., the aforementioned groups of computational instructions) and are not limited to the granularity of a basic block, so can include sub-basic-block decompositions, multiple full kernels as a superset of the domain of optimization, or other options. In the following, the term "group of computational instructions" is used, with a basic block being a specific implementation of a group of computational instructions. In the present disclosure, the terms "basic block" and "group of computational instructions" may be used interchangeably. Therefore, even if the term "basic block" is used, the concept may also be applied to groups of computational instructions having a different level of granularity. These groups of computational instructions may make up the compute kernel, with the interdependence between the groups of computational instructions being modelled by the vertices of the CDFG. For example, each group of computational instructions may have a single control flow entry and a single control flow exit point. Around a control flow decomposition of a kernel, the following concepts and techniques are introduced:

Basic blocks (the term "basic block" is used in the following in lieu of a group of computational instructions) can be clocked at differing fine-granular frequencies (including policy configurable and manageable by secure TEE (Trusted Execution Environment) with IP (Intellectual Property block)/Card/System Level) from each other, even when they belong to the same kernel. Multiple kernels or basic blocks with any single kernel can be driven with divergent clock frequencies without reduction of system-level latency and/or throughput constraints, with appropriate selection of target frequencies. Some example structures are shown in FIGS. 2 and 3, with both cases representing examples where each basic block may be driven with a different target frequency.

The proposed concept is centered around determining, for groups of computational instructions outside the performance-critical compute graph, a reduced clock frequency being lower than the maximally feasible clock frequency of the respective group of computational instructions. In the following, some examples are given on how such a reduced clock frequency can be determined.

In the following, an example of a four-stage process for determining and applying the different clock rates is shown. As shown in FIG. 4, determining, and then realizing the clock rate of a basic block (or more generally a group of computational instructions) may be split into four major phases for the purposes of this disclosure.

In a first stage 410, for every basic block, a target (i.e., desired) clock frequency may be determined. For example, the (target or desired) clock rate of a basic block may be chosen based on throughput or latency improvement or optimization of the data moving through that basic block, such that the selected clock frequency does not bottleneck or degrade performance of the full kernel. In other words, the reduced clock frequency may be generated such, that a reduction of performance of the overall compute kernel due to the reduced frequency is avoided. In this context, the aforementioned performance of the overall compute kernel relates to at least one of a throughput of the overall compute kernel, a latency of the overall compute kernel and a power consumption of the overall compute kernel. In the following examples, the throughput (i.e., how much data can be processed by the compute kernel in a given amount of time) and/or the latency (i.e., how much time does it take the compute kernel to process a given amount of data) are mainly discussed. However, another performance metric may be the power consumption of the computing architecture—the reduced clock frequency may be selected such, that the power consumption of the computing architecture does not increase (or does decrease at least a pre-defined target percentage) relative to the homogeneous use of a single (maximally feasible) clock frequency across all groups of computational instructions.

Target frequencies may be determined based on models of time delays through each data flow chain of instructions within a basic block. In general, there are various approaches for determining the target or desired clock rate (which may correspond to the reduced clock rate for the groups of computational instructions outside the performance-critical compute path). Such information can be obtained through static compiler analysis of the CDFG or though hardware or emulated device telemetry, with telemetry potentially providing higher fidelity when the control flow is dependent on input data, or when the compiler otherwise fails to generate adequate criticality analysis results for the code structures. In other words, the processing circuitry may be configured to determine the reduced clock frequency based on static analysis of the control and data flow graph representing the compute kernel. For example, the processing circuitry may be configured to determine the number and type of computations required within each group of computational instructions (including loops), and to derive the computational effort from the number and type of computations required within each group of computational instructions. Additionally, or alternatively, the reduced clock frequency may be determined based on an emulation of the compute kernel or based on an execution of the compute kernel on the plurality of units of computing circuitry. In other words, the compute kernel may be executed in an emulation or on the actual computing architecture, and the performance (i.e., throughput, latency and/or power consumption) of the groups of computational instructions may be determined based on the execution. For example, the compute kernel may be executed with different clock frequencies to determine some of the performance metrics. For example, this can be evaluated in a sandbox environment before actual workload placement to factor in real-time constraints.

In the case of divergent and then re-convergent control flow paths, such as shown in FIG. 3, the target frequencies of groups of computational instructions (e.g., basic blocks) may be balanced such that latencies or throughputs of the paths are balanced (i.e., they are harmonized, resulting in similar throughputs or latencies), with shorter basic blocks (in terms of a compute latency goal) or lower bandwidth need (in terms of a throughput goal) running at slower clock frequencies. In other words, the reduced clock frequency may be generated such, that a time required for executing groups of computational instructions being executed in parallel is balanced (e.g., such that the time required for executing groups of computational instructions being executed in parallel becomes substantially similar, by extending the time required for executing groups of computational instructions outside the performance-critical compute path through the use of reduced clock frequencies). This optimization may be further applicable to sets of kernels that communicate through first-in-first-out buffers (i.e., pipes in OpenCL and SYCL terminology), where there is strong advantage to frequency balancing kernels and basic blocks within them since one kernel would otherwise bottleneck other kernels which are unnecessarily executing at higher frequencies (with resultant power and resource utilization costs).

The path from data entering the implementation of a CDFG until results exit typically contains multiple parallel as well as serial (in-order) sub-graphs. At least some basic blocks do not need to run at the maximum achievable frequency on a spatial device because they are not on the critical/limiting compute path and may execute at reduced frequencies without negatively impacting the aggregate kernel throughput. The goal of the target frequency determination in the first stage 410 and hardware frequency selection in the third stage 430 may be to run all basic blocks at the minimum possible frequency, up to the point where further reduction produces marginal performance decrease from the aggregate kernel, while considered simultaneously with the resource costs of clock crossing adapters between clock domains.

In general, the determination of the reduced clock frequency (or frequencies) is tightly interwoven with the generation of the logic and eventual place-and-route of the generated logic. The processing circuitry is configured to generate the logic to be performed by one or more of the plurality of separately controllable units of computing circuitry based on the compute kernel, with a portion of the logic that is generated based on the at least one group of computational instructions outside the performance-critical compute path being generated based on the reduced clock frequency. This primarily affects the insertion of registers into the logic. In particular, registers may be inserted into the design based on timing models. Pre-compile pipelining may be performed based on the target clock rate(s) of the respective groups of computational instructions and achieved through register insertion into the design at locations/intervals determined through delay models. In other words, the processing circuitry may be configured to insert registers being used for pipelining into the logic based on the reduced clock frequency. Accordingly, as further shown in FIG. 1b, the method may comprise inserting 171 registers being used for pipelining into the logic based on the reduced clock frequency. As outlined above, the insertion of registers into the logic is primarily based on the target frequency of the respective group of computational instructions, as a faster clock frequency means that fewer gates or configurable logic blocks can be traversed by a signal until the next edge of the clock signal arrives. To avoid an unstable circuit, the signal is buffered in a register, and can then traverse the next sequence of gates or configurable logic blocks until the next register during the next clock cycle. The higher the clock frequency being used for executing a group of computational instructions, the more registers need to be inserted into the logic.

Apart from registers, additional elements may be used (e.g., included or inserted) into the logic to support the use of different clock domains. In particular, (configurable) clock dividers or (configurable) clock multipliers may be used for (e.g., included or inserted into) the logic to generate, or rather derive, the different clock frequencies from the clock signal generators (e.g., phase-locked loops, PLLs). For example, the processing circuitry may be configured to use (e.g., include or insert) at least one of one or more clock dividers (e.g., one or more configurable clock dividers) and one or more clock multipliers (e.g., one or more configurable clock multipliers) into the logic based on the reduced clock frequency. Accordingly, as further shown in FIG. 1b, the method may comprise using (e.g., including or inserting) 172 at least one of one or more (configurable) clock dividers and one or more (configurable) clock multipliers into the logic based on the reduced clock frequency. For example, the clock divider(s) and/or clock multiplier(s) may be used (e.g., included or inserted) based on a frequency of one or more PLLs of the computing architecture.

In general, not all basic blocks need to be in different clock domains. Activation analysis based on control flow graph traversal can be used to create groupings of basic blocks and therefore larger clock domains, reducing the required clock crossing logic and reducing complexity of the clock distribution schemes. For example, constraints may be set for the generation of the logic that are aimed at keeping the number of different clock domains small. For example, the processing circuitry may be configured to determine the reduced clock frequency with a constraint regarding a number of different reduced clock frequencies. Additionally, or alternatively, the implementation effort may be reduced by determining the reduced frequency or frequencies (and the frequency being used for the groups of computational instructions on the performance-critical compute path) based on a common base frequency (e.g., such that they can be derived from the same or from a limited number of different PLLs. For example, basic blocks may be clocked at integer multiples of a common base clock frequency to simplify the inter-block interfaces. In other words, the reduced frequency may be determined such, that a first clock frequency of a first group of computational instructions being on the performance-critical compute path (or a first clock frequency of a first group of computational instructions being outside the performance-critical compute path) and a second (and different) reduced clock frequency of a second group of computational instructions being outside the performance-critical compute path is derived from a frequency of a phase-locked loop commonly used by the first and second group of computational instructions. Alternatively (or additionally, if a mix of techniques is used), basic blocks may be clocked at unrelated frequencies in which case clock crossing bridge logic may be inserted by the compiler at cross-domain interfaces.

Setting target frequencies at this stage is a primary target of the improvements or optimizations described in this disclosure, and output is typically (but not restricted to) hardware description language expression of the design for ingestion by a CAD toolchain. In other words, the processing circuitry may be configured to generate the logic as code according to a hardware description language.

In a second stage 420, (all) basic blocks may be compiled through the (place-and-route) CAD (Computer-Aided Design) flow (e.g., Quartus) to achieve placed and routed device configuration bitstream. In other words, the processing circuitry may be configured to perform place and route operations for the logic based on the reduced clock frequency determined in the first stage. Accordingly, the method may comprise performing 176 place and route operations based on the reduced clock frequency. As this reduced clock frequency may be changed after place-and-route (see also the third stage), it may also be denoted an initial reduced clock frequency. Consequently, the act of determining the reduced clock frequency may comprise determining 161 an initial reduced clock frequency, performing 176 place and route operations for the logic based on the initial reduced clock frequency, and determining 160 (e.g., adjusting) the reduced clock frequency (that is being used in the end) based on an output of the place and route operations. For example, the place and route operations may include improvement or optimization techniques such as retiming to improve frequency impact of the registers inserted in the first stage, based on more detailed timing information and other aspects of the place and route flow.

In a third stage 430, based on the respective maximal frequency achieved by the CAD tools for each block, it may be determined what frequencies to run each basic block at. This may correspond to the aforementioned determination of the reduced clock frequency based on an output of the place and route operations. In general, the CAD tools in the second stage typically do not achieve the exact requested clock rate from the first stage for a variety of reasons. Based on the frequency achieved (Fmax) by the CAD tools for each independent group of computational instructions (e.g., basic block), the frequency decisions for all blocks may be holistically revisited to balance with the lowest common denominator result, to reduce power consumption without impacting the realized aggregate kernel throughput. Not all groups of computational instructions (e.g., basic blocks) might be configured to run in hardware at their maximum feasible frequency, if reductions can result in identical kernel-level throughput and latencies.

In a fourth stage 440, a bitstream may be programmed to the device, including clock frequency configuration for each (clock) domain. In other words, the processing circuitry may be configured to specify at least one PLL setting of the computing architecture (e.g., of the FPGA) based on the reduced clock frequency. Accordingly, the method may comprise specifying 180 the at least one PLL setting of the computing architecture based on the reduced clock frequency. The processing circuitry may be configured to synthesize a bit stream for programming the computing circuitry (e.g., the plurality of logic tiles of the field-programmable gate array) based on the logic (that is based on the at least one reduced clock frequency). For example, the method may comprise synthesizing 190 a bit stream for programming the computing circuitry based on the logic. For example, the bit stream may comprise or be based on the specified at least one PLL setting. Alternatively, hardware PLL (Phase-Locked Loop) clock configuration (of the computing architecture) may be performed at runtime, based on the results of the third stage, through any of the existing mechanisms available to configure PLL or other configurable clock generator settings. For example, the processing circuitry may be configured to provide the bitstream via the interface circuitry 12 and/or to store the bitstream using the storage circuitry 18. For example, the processing circuitry may be configured to provide the bitstream to the computing architecture 20 (via the interface circuitry 12), e.g., to program the processing circuitry 22 of the computing architecture 20.

In the aforementioned examples, it was implicitly assumed that the computing circuitry is part of the same processing unit, e.g., part of the same FPGA or GPU. However, the concept is not limited to such scenarios. In some examples, the computing circuitry may be part of different processing units of the same computer system, e.g., of different FPGAs or GPUs, or of a mix thereof. In other words, the plurality of units of computing circuitry may comprise units of computing circuitry of at least two different processing units of a computer system. Moreover, the concept may be extended to computing circuitry of different processing units hosted by different computer systems as well. In other words, the plurality of units of computing circuitry comprise units of computing circuitry of at least two different processing units of at least two different computer systems. In these cases, the computing architecture may comprise the at least two different processing units.

The proposed concept may provide a concept that results in improved resource utilization and power consumption metrics without system-level performance degradation. Implementing the described techniques may improve a quality of results across different designs. Moreover, reduction of resource utilization may further increase system-level performance by freeing spatial resources for use by performance critical data paths. The frequency and resource optimizations described may be performed without any user interaction and may be enabled through coupling with advanced HLD (High-Level Design) timing models and delay scaling technology. The result is a concept for an improvement optimization strategy offering widespread FPGA designer impact, e.g., through Intel® oneAPI.

The aforementioned concept may be extended in different ways by introducing some additional improvements or optimizations, which will be introduced in the following.

As has been outlined above, implementing some instructions with a reduced clock frequency can have benefits with respect to power consumption and logic required for implementation (due to fewer registers being used). Therefore, it may be desirable to move instructions out of the performance-critical compute path, so they can potentially also be executed with a reduced clock frequency. Heterogeneous clocking may provide a new compiler optimization target, in which instructions may be hoisted or lowered (i.e., moved) to groups of instructions (e.g., basic blocks) with a lower clock frequency target when the transform is functionally invariant, subject to live state crossing costs between basic blocks. For example, as mentioned before, the compute kernel may be generated 110 by compiling code of a high-level programming language. During compilation, some (e.g., at least one) of the computational instructions that were originally in a group of computational instructions on the performance-critical compute path may be moved to a group of computational instructions outside the performance-critical compute path. In other words, compiling the code may comprise moving one or more computational instructions from a group of computational instructions being part of the performance-critical compute path to another group of computational instructions being outside of the performance-critical compute path. To a first level approximation, the transform may be considered beneficial when any additional live state registering between basic blocks is cheaper in bit registering cost than the frequency pipelining cost of that computation within the higher frequency basic block.

Additionally, clock gating may be introduced to further reduce the power consumption. Some groups of computational instructions (e.g., basic blocks) are used for single shot or very infrequent tasks, such as initialization of data at the start of kernel execution or computation of uniform data for a grouping of work-items. Such tasks may further be required only once after a reset operation, such as initialization of a constant memory, and not repeated even for additional invocations of the kernel. These basic blocks may have their clock disabled (gated) after execution to further reduce power. In other words, the processing circuitry may be configured to identify at least one second group of computational instructions that is used once or less frequently than other groups of computational instructions (e.g., only during initialization of the data or start of execution of the compute kernel). Accordingly, the method may comprise identifying 140 at least one second group of computational instructions that may be used once or less frequently than other groups of computational instructions. The logic may be generated such, that a second portion of the logic that is based on the at least one second group of computational instructions may be clock-gated. In other words, the logic may be generated such, that the second portion of the logic is separated (i.e., gated) from the respective clock signal being used for the second portion of the logic when the respective functionality is not required (e.g., after initialization or start of execution). Completion of their execution can automatically trigger the clock gating operation, for example through a combined valid signal leaving the group of computational instructions which may enable (e.g., trigger) a clock gating circuit. This point applies also to groups of computational instructions that are executed less frequently than transitively downstream blocks, such as the blocks implementing an outer loop of logic with an inner loop downstream in the CDFG.

Moreover, some basic blocks or paths within them do not produce a new output value every clock cycle (e.g., when a memory access base address is computed and then held constant/invariant for some number of side-path cycles). These blocks are candidates for multiple additional improvements or optimizations once it is possible to drive blocks with heterogeneous clock rates. Particularly, there is justification to hoist (i.e., move) parts of address computation to earlier in the data path (e.g., to move them into a different group of computational instructions), to allow for reduced clock rates to be hidden in the consumption schedule. For many-cycle hold times of outputs, periodic clock gating of low-production basic blocks may further reduce power consumption, where the clock is enabled for x out of every y clock cycles. For this purpose, at least one third group of computational instructions may be identified, which is updated less frequently than other blocks. The processing circuitry may be configured to identify the at least one third group of computational instructions that is configured to generate an updated output less frequently than other groups of computational instructions (i.e., that has a hold time at its output of many clock cycles, e.g., at least a pre-determined number of clock cycles). Accordingly, the method may comprise identifying 150 the at least one third group of computational instructions that is configured to generate an updated output less frequently than other groups of computational instruction. In this case, the logic may be generated such, that a third portion of the logic that is based on the at least one third group of computational instructions is clock-gated (periodically). For example, the clock being used for the at least one third group of computational instructions may be enabled for the aforementioned x out of every y clock cycles. This point applies also to basic blocks that are executed less frequently than transitively downstream blocks, such as the blocks implementing an outer loop of logic with an inner loop downstream in the CDFG.

Dynamic scaling based on sensing telemetry may be used that can help to aid the design with wiggle room for future newer emerging workloads post deployment (e.g., many CSPs (Cloud Service Providers) use silicon during 7-10 years average span, during which Deep Learning workloads might see many disruptive workload trends that need flexibility). Such dynamic scaling may be implemented using a combination of monitoring logic and logic for configuring the clock divider(s), clock multiplier(s) and/or PLLs. For example, the processing circuitry may be configured to use (e.g., insert or include) logic for monitoring the execution of the at least one group of computational instructions outside the performance-critical compute path. Accordingly, as further shown in FIG. 1b, the method may comprise using (e.g., inserting or including) 173 logic for monitoring the execution of the at least one group of computational instructions outside the performance-critical compute path. Additionally, logic for configuring the one of one or more configurable clock dividers and/or one or more configurable clock multipliers based on the monitoring and/or logic for controlling a phase-locked loop setting of the computing architecture (e.g., the FPGA) based on the monitoring may be used (e.g., inserted or included in the logic). In other words, as further shown in FIG. 1b, the method may comprise using (e.g., inserting or including) 174 logic for configuring the one of one or more configurable clock dividers and/or one or more configurable clock multipliers based on the monitoring and/or using (e.g., inserting or including) 175 logic for controlling a phase-locked loop setting of the computing architecture based on the monitoring. For example, the logic for configuring the one of one or more configurable clock dividers and/or one or more configurable clock multipliers based on the monitoring and/or the logic for controlling a phase-locked loop setting of the computing architecture based on the monitoring may be configured to adjust the one or more configurable clock dividers and/or one or more configurable clock multipliers and/or the PLL setting based on the monitoring such, that the performance is not negatively affected (e.g., that no additional delay is introduced and/or such that the throughput is not negatively affected). For this purpose, the respective logic may be configured to determine an adjusted clock frequency based on the monitoring (that avoids negatively affecting the performance), and to adjust the one or more configurable clock dividers and/or one or more configurable clock multipliers and/or the PLL setting based on the adjusted clock frequency. Clock domain snapshots for effective thermal & TDP (Thermal Design Power) throttling may be accomplished in a fine granular intra/inter kernel level across one or more IPs within a processing unit (e.g., the aforementioned FPGA, GPU or more generally Accelerator Interface Card (AIC)) or across processing units in a system.

The interface circuitry 12 or means for communicating 12 may correspond to one or more inputs and/or outputs for receiving and/or transmitting information, which may be in digital (bit) values according to a specified code, within a module, between modules or between modules of different entities. For example, the interface circuitry 12 or means for communicating 12 may comprise circuitry configured to receive and/or transmit information.

For example, the processing circuitry 14 or means for processing 14 may be implemented using one or more processing units, one or more processing devices, any means for processing, such as a processor, a computer or a programmable hardware component being operable with accordingly adapted software. In other words, the described function of the processing circuitry 14 or means for processing may as well be implemented in software, which is then executed on one or more programmable hardware components. Such hardware components may comprise a general-purpose processor, a Digital Signal Processor (DSP), a micro-controller, etc.

For example, the memory circuitry 16 or memory 16 may comprise volatile or non-volatile memory, e.g., circuitry for providing volatile or non-volatile memory. For example, the memory circuitry or memory 16 may be random-access memory (RAM), such as dynamic random-access memory (DRAM) or static random-access memory (SRAM), or persistent memory (PMEM). For example, at least a portion of the memory circuitry may be part of the processing circuitry, e.g., registers of the processing circuitry.

For example, the storage circuitry 18 or means for storing information 18 may comprise at least one element of the group of a computer readable storage medium, such as a magnetic or optical storage medium, e.g., a hard disk drive, a flash memory, Floppy-Disk, Random Access Memory (RAM), Programmable Read Only Memory (PROM), Erasable Programmable Read Only Memory (EPROM), an Electronically Erasable Programmable Read Only Memory (EEPROM), or a network storage.

For example, the computer system 100 may be a workstation computer system (e.g., a workstation computer system being used for scientific computation).

More details and aspects of the apparatus 10, device 10, method, computer program, computer system and computing architecture are mentioned in connection with the proposed concept, or one or more examples described above or below (e.g., FIGS. 2 to 4) The apparatus 10, device 10, method, computer program, computer system and computing architecture may comprise one or more additional optional features corresponding to one or more aspects of the proposed concept or one or more examples described above or below.

FIG. 2 shows a schematic diagram of a control flow decomposition of an illustrative trivial program, where BB1 (Basic Block 1) 220 forms the body of a loop that is repeatedly executed (e.g., n executions). Paying resource utilization (register) and power cost for BB1 makes system-level optimization sense, while paying those costs for BB0 210 (before loop, 1 execution) and BB2 230 (after loop, 1 execution) does not if the number of BB1 loop iterations is large. Paying power and resource utilization for improved frequency of the loop body may be more impactful than for basic blocks 0 and 2. Most real program structures are significantly more complex than this example, but the principles still apply.

FIG. 3 shows a schematic diagram of parallel work nodes in the CDFG, e.g., in a latency-constrained scenario, where control flow diverges from BB3 310 into BB4 320, BB5 330, and BB6 340 (hosting parallel work items A (a clock cycles long), B (b clock cycles long) and C (c block cycles long), before reconverging into a single BB7 350. BB7 cannot execute until BB4-6 have completed execution. For a latency reducing or minimizing objective, based on the longest modeled clock cycle delay chain (sequences of dependent data flow operations) within each of BB4-6, each can receive a target clock frequency which balances the completion time of each block to be approximately equivalent while minimizing the register resource utilization and power consumption of the shorter delay chain blocks. In FIG. 3, the passage of time is shown from top to bottom. This style of CDFG frequency balancing takes latency but not throughput as an optimization objective, so is most applicable for application with latency constraints. A similar optimization may be performed for throughput targeted kernels, where the throughput in words/cycle of transitively re-convergent paths is balanced through clock frequency selection.

FIG. 4 shows a schematic diagram of a four-stage approach to determining clock frequencies and programming computing circuitry. As outlined above, in the first stage 410, for every basic block, a target (i.e., desired) clock frequency may be determined, and registers may be inserted into the design based on timing models. In the second stage 420, (all) basic blocks may be compiled through the (place-and-route) CAD (Computer-Aided Design) flow (e.g., Quartus) to achieve placed and routed device configuration bitstream. In the third stage 430, based on the respective maximal frequency achieved by the CAD tools for each block, it may be determined what frequencies to run each basic block at. In the fourth stage 440, a bitstream may be programmed to the device, including clock frequency configuration for each (clock) domain.

More details and aspects of the heterogeneous clocking approach are mentioned in connection with the proposed concept, or one or more examples described above or below (e.g., FIG. 1a to 1b). The heterogeneous clocking approach may comprise one or more additional optional features corresponding to one or more aspects of the proposed concept, or one or more examples described above or below.

In the following, some examples of the proposed concept are discussed:

An example (e.g., example 1) relates to an apparatus (10) comprising interface circuitry (12), machine-readable instructions and processing circuitry (14) to execute the machine-readable instructions to determine a performance-critical compute path of a compute kernel to be executed on a plurality of units of computing circuitry of a computing architecture, the compute kernel comprising a plurality of interdependent groups of computational instructions, with the performance-critical compute path being based on a subset of the interdependent groups of computational instructions. The processing circuitry is configured to execute the machine-readable instructions to determine, for at least one group of computational instructions outside the performance-critical compute path, a reduced clock frequency being lower than a maximally feasible clock frequency of the respective group of computational instructions. The processing circuitry is configured to execute the machine-readable instructions to generate logic to be performed by one or more of the plurality of separately controllable units of computing circuitry based on the compute kernel, wherein a portion of the logic that is generated to be performed by the plurality of separately controllable units of computing circuitry outside the performance-critical compute path is generated based at least in part on the reduced clock frequency.

Another example (e.g., example 2) relates to a previously described example (e.g., example 1) or to any of the examples described herein, further comprising that the plurality of units of computing circuitry are separately controllable at least with respect to a clock frequency being used to operate the respective unit of computing circuitry.

Another example (e.g., example 3) relates to a previously described example (e.g., one of the examples 1 to 2) or to any of the examples described herein, further comprising that the plurality of units of computing circuitry of the computing architecture comprises a plurality of logic tiles of a field-programmable gate array, with the plurality of logic tiles being operable at different clock frequencies.

Another example (e.g., example 4) relates to a previously described example (e.g., example 3) or to any of the examples described herein, further comprising that the machine-readable instructions comprise instructions to generate the logic such, that logic tiles used for executing the at least one group of computational instructions outside the performance-critical compute path are operated based on the reduced clock frequency.

Another example (e.g., example 5) relates to a previously described example (e.g., one of the examples 3 to 4) or to any of the examples described herein, further comprising that the machine-readable instructions comprise instructions to synthesize a bit stream for programming the plurality of logic tiles of the field-programmable gate array based on the logic.

Another example (e.g., example 6) relates to a previously described example (e.g., one of the examples 3 to 5) or to any of the examples described herein, further comprising that the act of determining the reduced clock frequency comprises determining an initial reduced clock frequency, performing place and route operations for the logic based on the initial reduced clock frequency, and determining the reduced clock frequency based on an output of the place and route operations.

Another example (e.g., example 7) relates to a previously described example (e.g., one of the examples 3 to 6) or to any of the examples described herein, further comprising that the machine-readable instructions comprise instructions to insert registers being used for pipelining into the logic based on the reduced clock frequency.

Another example (e.g., example 8) relates to a previously described example (e.g., one of the examples 3 to 7) or to any of the examples described herein, further comprising that the machine-readable instructions comprise instructions to generate the logic as code according to a hardware description language.

Another example (e.g., example 9) relates to a previously described example (e.g., one of the examples 3 to 8) or to any of the examples described herein, further comprising that the machine-readable instructions comprise instructions to use at least one of one or more clock dividers and one or more clock multipliers for the logic based on the reduced clock frequency.

Another example (e.g., example 10) relates to a previously described example (e.g., example 9) or to any of the examples described herein, further comprising that the machine-readable instructions comprise instructions to insert at least one of one or more configurable clock dividers and one or more configurable clock multipliers into the logic based on the reduced clock frequency.

Another example (e.g., example 11) relates to a previously described example (e.g., example 10) or to any of the examples described herein, further comprising that the machine-readable instructions comprise instructions to insert logic for monitoring the execution of the at least one group of computational instructions outside the performance-critical compute path, and logic for configuring the one of one or more configurable clock dividers and/or one or more configurable clock multipliers based on the monitoring.

Another example (e.g., example 12) relates to a previously described example (e.g., one of the examples 3 to 11) or to any of the examples described herein, further comprising that the machine-readable instructions comprise instructions to specify at least one phase-locked loop setting of the field-programmable gate array based on the reduced clock frequency.

Another example (e.g., example 13) relates to a previously described example (e.g., one of the examples 3 to 12)

or to any of the examples described herein, further comprising that the machine-readable instructions comprise instructions to insert logic for monitoring the execution of the at least one group of computational instructions outside the performance-critical compute path, and logic for controlling a phase-locked loop setting of the field-programmable gate array based on the monitoring.

Another example (e.g., example 14) relates to a previously described example (e.g., one of the examples 1 to 13) or to any of the examples described herein, further comprising that the machine-readable instructions comprise instructions to determine the reduced clock frequency with a constraint regarding a number of different reduced clock frequencies.

Another example (e.g., example 15) relates to a previously described example (e.g., one of the examples 1 to 14) or to any of the examples described herein, further comprising that the machine-readable instructions comprise instructions to determine the reduced clock frequency based on static analysis of a control and data flow graph representing the compute kernel.

Another example (e.g., example 16) relates to a previously described example (e.g., one of the examples 1 to 15) or to any of the examples described herein, further comprising that the machine-readable instructions comprise instructions to determine the reduced clock frequency based on an emulation of the compute kernel.

Another example (e.g., example 17) relates to a previously described example (e.g., one of the examples 1 to 16) or to any of the examples described herein, further comprising that the machine-readable instructions comprise instructions to determine the reduced clock frequency based on an execution of the compute kernel on the plurality of units of computing circuitry.

Another example (e.g., example 18) relates to a previously described example (e.g., one of the examples 1 to 17) or to any of the examples described herein, further comprising that the reduced frequency is determined such, that a first clock frequency of a first group of computational instructions being on the performance-critical compute path and a second reduced clock frequency of a second group of computational instructions being outside the performance-critical compute path is derived from a frequency of a phase-locked loop commonly used by the first and second group of computational instructions.

Another example (e.g., example 19) relates to a previously described example (e.g., one of the examples 1 to 18) or to any of the examples described herein, further comprising that the reduced clock frequency is generated such, that a reduction of performance of the overall compute kernel due to the reduced frequency is avoided.

Another example (e.g., example 20) relates to a previously described example (e.g., one of the examples 1 to 19) or to any of the examples described herein, further comprising that the performance of the performance-critical compute path and/or of an overall compute kernel relates to at least one of a latency, a throughput, and a power consumption.

Another example (e.g., example 21) relates to a previously described example (e.g., one of the examples 1 to 20) or to any of the examples described herein, further comprising that the reduced clock frequency is generated such, that a time required for executing groups of computational instructions being executed in parallel is balanced.

Another example (e.g., example 22) relates to a previously described example (e.g., one of the examples 1 to 21) or to any of the examples described herein, further comprising that the machine-readable instructions comprise instructions to identify at least one second group of computational instructions that is used once or less frequently than other groups of computational instructions, and to generate the logic such, that a second portion of the logic that is based on the at least one second group of computational instructions is clock-gated.

Another example (e.g., example 23) relates to a previously described example (e.g., one of the examples 1 to 22) or to any of the examples described herein, further comprising that the machine-readable instructions comprise instructions to identify at least one third group of computational instructions that is configured to generate an updated output less frequently than other groups of computational instructions, and to generate the logic such, that a third portion of the logic that is based on the at least one third group of computational instructions is clock-gated.

Another example (e.g., example 24) relates to a previously described example (e.g., one of the examples 1 to 23) or to any of the examples described herein, further comprising that the machine-readable instructions comprise instructions to generate the compute kernel by compiling code of a high-level programming language, wherein compiling the code comprises moving one or more computational instructions from a group of computational instructions being part of the performance-critical compute path to another group of computational instructions being outside of the performance-critical compute path.

Another example (e.g., example 25) relates to a previously described example (e.g., one of the examples 1 to 24) or to any of the examples described herein, further comprising that the machine-readable instructions comprise instructions to determine the performance-critical compute path of the compute kernel based on a control and data flow graph of the compute kernel, with vertices of the control and data flow graph representing the computational instructions and edges of the control and data flow graph representing the interdependence between the computational instructions.

Another example (e.g., example 26) relates to a previously described example (e.g., example 25) or to any of the examples described herein, further comprising that each group of computational instructions has a single control flow entry and a single control flow exit point.

Another example (e.g., example 27) relates to a previously described example (e.g., one of the examples 25 to 26) or to any of the examples described herein, further comprising that the machine-readable instructions comprise instructions to generate the control and data flow graph based on the compute kernel.

Another example (e.g., example 28) relates to a previously described example (e.g., one of the examples 1 to 27) or to any of the examples described herein, further comprising that the plurality of units of computing circuitry comprise units of computing circuitry of at least two different processing units of a computer system.

Another example (e.g., example 29) relates to a previously described example (e.g., one of the examples 1 to 28) or to any of the examples described herein, further comprising that the plurality of units of computing circuitry comprise units of computing circuitry of at least two different processing units of at least two different computer systems.

An example (e.g., example 30) relates to a computer system comprising the apparatus according to one of the examples 1 to 29.

An example (e.g., example 31) relates to an apparatus (10) comprising processing circuitry (14) and memory circuitry (16), the processing circuitry being configured to determine a performance-critical compute path of a compute kernel to be executed on a plurality of units of computing circuitry of a computing architecture, the compute kernel comprising a plurality of interdependent groups of computational instructions, with the performance-critical compute path being based on a subset of the interdependent groups of computational instructions. The processing circuitry is configured to determine, for at least one group of computational instructions outside the performance-critical compute path, a reduced clock frequency being lower than a maximally feasible clock frequency of the respective group of computational instructions. The processing circuitry is configured to generate logic to be performed by one or more of the plurality of separately controllable units of computing circuitry based on the compute kernel, wherein a portion of the logic that is generated to be performed by the plurality of separately controllable units of computing circuitry outside the performance-critical compute path is generated based at least in part on the reduced clock frequency.

Another example (e.g., example 32) relates to a previously described example (e.g., example 31) or to any of the examples described herein, further comprising that the plurality of units of computing circuitry are separately controllable at least with respect to a clock frequency being used to operate the respective unit of computing circuitry.

Another example (e.g., example 33) relates to a previously described example (e.g., one of the examples 31 to 32) or to any of the examples described herein, further comprising that the plurality of units of computing circuitry of the computing architecture comprises a plurality of logic tiles of a field-programmable gate array, with the plurality of logic tiles being operable at different clock frequencies.

Another example (e.g., example 34) relates to a previously described example (e.g., example 33) or to any of the examples described herein, further comprising that the processing circuitry is configured to generate the logic such, that logic tiles used for executing the at least one group of computational instructions outside the performance-critical compute path are operated based on the reduced clock frequency.

Another example (e.g., example 35) relates to a previously described example (e.g., one of the examples 33 to 34) or to any of the examples described herein, further comprising that the processing circuitry is configured to synthesize a bit stream for programming the plurality of logic tiles of the field-programmable gate array based on the logic.

Another example (e.g., example 36) relates to a previously described example (e.g., one of the examples 33 to 35) or to any of the examples described herein, further comprising that the act of determining the reduced clock frequency comprises determining an initial reduced clock frequency, performing place and route operations for the logic based on the initial reduced clock frequency, and determining the reduced clock frequency based on an output of the place and route operations.

Another example (e.g., example 37) relates to a previously described example (e.g., one of the examples 33 to 36) or to any of the examples described herein, further comprising that the processing circuitry is configured to insert registers being used for pipelining into the logic based on the reduced clock frequency.

Another example (e.g., example 38) relates to a previously described example (e.g., one of the examples 33 to 37) or to any of the examples described herein, further comprising that the processing circuitry is configured to generate the logic as code according to a hardware description language.

Another example (e.g., example 39) relates to a previously described example (e.g., one of the examples 33 to 38) or to any of the examples described herein, further comprising that the processing circuitry is configured to use at least one of one or more clock dividers and one or more clock multipliers for the logic based on the reduced clock frequency.

Another example (e.g., example 40) relates to a previously described example (e.g., example 39) or to any of the examples described herein, further comprising that the processing circuitry is configured to insert at least one of one or more configurable clock dividers and one or more configurable clock multipliers into the logic based on the reduced clock frequency.

Another example (e.g., example 41) relates to a previously described example (e.g., example 40) or to any of the examples described herein, further comprising that the processing circuitry is configured to use logic for monitoring the execution of the at least one group of computational instructions outside the performance-critical compute path, and logic for configuring the one of one or more configurable clock dividers and/or one or more configurable clock multipliers based on the monitoring.

Another example (e.g., example 42) relates to a previously described example (e.g., one of the examples 33 to 41) or to any of the examples described herein, further comprising that the processing circuitry is configured to specify at least one phase-locked loop setting of the field-programmable gate array based on the reduced clock frequency.

Another example (e.g., example 43) relates to a previously described example (e.g., one of the examples 33 to 42) or to any of the examples described herein, further comprising that the processing circuitry is configured to use logic for monitoring the execution of the at least one group of computational instructions outside the performance-critical compute path, and logic for controlling a phase-locked loop setting of the field-programmable gate array based on the monitoring.

Another example (e.g., example 44) relates to a previously described example (e.g., one of the examples 31 to 43) or to any of the examples described herein, further comprising that the processing circuitry is configured to determine the reduced clock frequency with a constraint regarding a number of different reduced clock frequencies.

Another example (e.g., example 45) relates to a previously described example (e.g., one of the examples 31 to 44) or to any of the examples described herein, further comprising that the processing circuitry is configured to determine the reduced clock frequency based on static analysis of a control and data flow graph representing the compute kernel.

Another example (e.g., example 46) relates to a previously described example (e.g., one of the examples 31 to 45) or to any of the examples described herein, further comprising that the processing circuitry is configured to determine the reduced clock frequency based on an emulation of the compute kernel.

Another example (e.g., example 47) relates to a previously described example (e.g., one of the examples 31 to 46) or to any of the examples described herein, further comprising that the processing circuitry is configured to determine the reduced clock frequency based on an execution of the compute kernel on the plurality of units of computing circuitry.

Another example (e.g., example 48) relates to a previously described example (e.g., one of the examples 31 to 47) or to any of the examples described herein, further comprising that the reduced frequency is determined such, that a first clock frequency of a first group of computational instructions being on the performance-critical compute path and a second reduced clock frequency of a second group of computational instructions being outside the performance-critical compute path is derived from a frequency of a phase-locked loop commonly used by the first and second group of computational instructions.

Another example (e.g., example 49) relates to a previously described example (e.g., one of the examples 31 to 48) or to any of the examples described herein, further comprising that the reduced clock frequency is generated such, that a reduction of performance of the overall compute kernel due to the reduced frequency is avoided.

Another example (e.g., example 50) relates to a previously described example (e.g., one of the examples 31 to 49) or to any of the examples described herein, further comprising that the performance of the performance-critical compute path and/or of an overall compute kernel relates to at least one of a latency, a throughput, and a power consumption.

Another example (e.g., example 51) relates to a previously described example (e.g., one of the examples 31 to 50) or to any of the examples described herein, further comprising that the reduced clock frequency is generated such, that a time required for executing groups of computational instructions being executed in parallel is balanced.

Another example (e.g., example 52) relates to a previously described example (e.g., one of the examples 31 to 51) or to any of the examples described herein, further comprising that the processing circuitry is configured to identify at least one second group of computational instructions that is used once or less frequently than other groups of computational instructions, and to generate the logic such, that a second portion of the logic that is based on the at least one second group of computational instructions is clock-gated.

Another example (e.g., example 53) relates to a previously described example (e.g., one of the examples 31 to 52) or to any of the examples described herein, further comprising that the processing circuitry is configured to identify at least one third group of computational instructions that is configured to generate an updated output less frequently than other groups of computational instructions, and to generate the logic such, that a third portion of the logic that is based on the at least one third group of computational instructions is clock-gated.

Another example (e.g., example 54) relates to a previously described example (e.g., one of the examples 31 to 53) or to any of the examples described herein, further comprising that the processing circuitry is configured to generate the compute kernel by compiling code of a high-level programming language, wherein compiling the code comprises moving one or more computational instructions from a group of computational instructions being part of the performance-critical compute path to another group of computational instructions being outside of the performance-critical compute path.

Another example (e.g., example 55) relates to a previously described example (e.g., one of the examples 31 to 54) or to any of the examples described herein, further comprising that the processing circuitry is configured to determine the performance-critical compute path of the compute kernel based on a control and data flow graph of the compute kernel, with vertices of the control and data flow graph representing the computational instructions and edges of the control and data flow graph representing the interdependence between the computational instructions.

Another example (e.g., example 56) relates to a previously described example (e.g., example 55) or to any of the examples described herein, further comprising that each group of computational instructions has a single control flow entry and a single control flow exit point.

Another example (e.g., example 57) relates to a previously described example (e.g., one of the examples 55 to 56) or to any of the examples described herein, further comprising that the processing circuitry is configured to generate the control and data flow graph based on the compute kernel.

Another example (e.g., example 58) relates to a previously described example (e.g., one of the examples 31 to 57) or to any of the examples described herein, further comprising that the plurality of units of computing circuitry comprise units of computing circuitry of at least two different processing units of a computer system.

Another example (e.g., example 59) relates to a previously described example (e.g., one of the examples 31 to 58) or to any of the examples described herein, further comprising that the plurality of units of computing circuitry comprise units of computing circuitry of at least two different processing units of at least two different computer systems.

An example (e.g., example 60) relates to a computer system comprising the apparatus according to one of the examples 31 to 59.

An example (e.g., example 61) relates to a device (10) comprising means for processing (14), the means for processing being configured to determine a performance-critical compute path of a compute kernel to be executed on a plurality of units of computing circuitry of a computing architecture, the compute kernel comprising a plurality of interdependent groups of computational instructions, with the performance-critical compute path being based on a subset of the interdependent groups of computational instructions. The means for processing is configured to determine, for at least one group of computational instructions outside the performance-critical compute path, a reduced clock frequency being lower than a maximally feasible clock frequency of the respective group of computational instructions. The means for processing is configured to generate logic to be performed by one or more of the plurality of separately controllable units of computing circuitry based on the compute kernel, wherein a portion of the logic that is generated to be performed by the plurality of separately controllable units of computing circuitry outside the performance-critical compute path is generated based at least in part on the reduced clock frequency.

Another example (e.g., example 62) relates to a previously described example (e.g., example 61) or to any of the examples described herein, further comprising that the plurality of units of computing circuitry are separately controllable at least with respect to a clock frequency being used to operate the respective unit of computing circuitry.

Another example (e.g., example 63) relates to a previously described example (e.g., one of the examples 61 to 62) or to any of the examples described herein, further comprising that the plurality of units of computing circuitry of the computing architecture comprises a plurality of logic tiles of a field-programmable gate array, with the plurality of logic tiles being operable at different clock frequencies.

Another example (e.g., example 64) relates to a previously described example (e.g., example 63) or to any of the examples described herein, further comprising that the means for processing is configured to generate the logic such, that logic tiles used for executing the at least one group of computational instructions outside the performance-critical compute path are operated based on the reduced clock frequency.

Another example (e.g., example 65) relates to a previously described example (e.g., one of the examples 63 to 64) or to any of the examples described herein, further comprising that the means for processing is configured to synthesize a bit stream for programming the plurality of logic tiles of the field-programmable gate array based on the logic.

Another example (e.g., example 66) relates to a previously described example (e.g., one of the examples 63 to 65) or to any of the examples described herein, further comprising that the act of determining the reduced clock frequency comprises determining an initial reduced clock frequency, performing place and route operations for the logic based on the initial reduced clock frequency, and determining the reduced clock frequency based on an output of the place and route operations.

Another example (e.g., example 67) relates to a previously described example (e.g., one of the examples 63 to 66) or to any of the examples described herein, further comprising that the means for processing is configured to insert registers being used for pipelining into the logic based on the reduced clock frequency.

Another example (e.g., example 68) relates to a previously described example (e.g., one of the examples 63 to 67) or to any of the examples described herein, further comprising that the means for processing is configured to generate the logic as code according to a hardware description language.

Another example (e.g., example 69) relates to a previously described example (e.g., one of the examples 63 to 68) or to any of the examples described herein, further comprising that the means for processing is configured to use at least one of one or more clock dividers and one or more clock multipliers for the logic based on the reduced clock frequency.

Another example (e.g., example 70) relates to a previously described example (e.g., example 69) or to any of the examples described herein, further comprising that the means for processing is configured to insert at least one of one or more configurable clock dividers and one or more configurable clock multipliers into the logic based on the reduced clock frequency.

Another example (e.g., example 71) relates to a previously described example (e.g., example 70) or to any of the examples described herein, further comprising that the means for processing is configured to use logic for monitoring the execution of the at least one group of computational instructions outside the performance-critical compute path, and logic for configuring the one of one or more configurable clock dividers and/or one or more configurable clock multipliers based on the monitoring.

Another example (e.g., example 72) relates to a previously described example (e.g., one of the examples 63 to 71) or to any of the examples described herein, further comprising that the means for processing is configured to specify at least one phase-locked loop setting of the field-programmable gate array based on the reduced clock frequency.

Another example (e.g., example 73) relates to a previously described example (e.g., one of the examples 63 to 72) or to any of the examples described herein, further comprising that the means for processing is configured to use logic for monitoring the execution of the at least one group of computational instructions outside the performance-critical compute path, and logic for controlling a phase-locked loop setting of the field-programmable gate array based on the monitoring.

Another example (e.g., example 74) relates to a previously described example (e.g., one of the examples 61 to 73) or to any of the examples described herein, further comprising that the means for processing is configured to determine the reduced clock frequency with a constraint regarding a number of different reduced clock frequencies.

Another example (e.g., example 75) relates to a previously described example (e.g., one of the examples 61 to 74) or to any of the examples described herein, further comprising that the means for processing is configured to determine the reduced clock frequency based on static analysis of a control and data flow graph representing the compute kernel.

Another example (e.g., example 76) relates to a previously described example (e.g., one of the examples 61 to 75) or to any of the examples described herein, further comprising that the means for processing is configured to determine the reduced clock frequency based on an emulation of the compute kernel.

Another example (e.g., example 77) relates to a previously described example (e.g., one of the examples 61 to 76) or to any of the examples described herein, further comprising that the means for processing is configured to determine the reduced clock frequency based on an execution of the compute kernel on the plurality of units of computing circuitry.

Another example (e.g., example 78) relates to a previously described example (e.g., one of the examples 61 to 77) or to any of the examples described herein, further comprising that the reduced frequency is determined such, that a first clock frequency of a first group of computational instructions being on the performance-critical compute path and a second reduced clock frequency of a second group of computational instructions being outside the performance-critical compute path is derived from a frequency of a phase-locked loop commonly used by the first and second group of computational instructions.

Another example (e.g., example 79) relates to a previously described example (e.g., one of the examples 61 to 78) or to any of the examples described herein, further comprising that the reduced clock frequency is generated such, that a reduction of performance of the overall compute kernel due to the reduced frequency is avoided.

Another example (e.g., example 80) relates to a previously described example (e.g., one of the examples 61 to 79) or to any of the examples described herein, further comprising that the performance of the performance-critical compute path and/or of an overall compute kernel relates to at least one of a latency, a throughput, and a power consumption.

Another example (e.g., example 81) relates to a previously described example (e.g., one of the examples 61 to 80) or to any of the examples described herein, further comprising that the reduced clock frequency is generated such, that a time required for executing groups of computational instructions being executed in parallel is balanced.

Another example (e.g., example 82) relates to a previously described example (e.g., one of the examples 61 to 81) or to any of the examples described herein, further comprising that the means for processing is configured to identify at least one second group of computational instructions that is used once or less frequently than other groups of computational instructions, and to generate the logic such, that a second portion of the logic that is based on the at least one second group of computational instructions is clock-gated.

Another example (e.g., example 83) relates to a previously described example (e.g., one of the examples 61 to 82) or to any of the examples described herein, further comprising that the means for processing is configured to identify at least one third group of computational instructions that is configured to generate an updated output less frequently than other groups of computational instructions, and to generate the logic such, that a third portion of the logic that is based on the at least one third group of computational instructions is clock-gated.

Another example (e.g., example 84) relates to a previously described example (e.g., one of the examples 61 to 83) or to any of the examples described herein, further comprising that the means for processing is configured to generate the compute kernel by compiling code of a high-level programming language, wherein compiling the code comprises moving one or more computational instructions from a group of computational instructions being part of the performance-critical compute path to another group of computational instructions being outside of the performance-critical compute path.

Another example (e.g., example 85) relates to a previously described example (e.g., one of the examples 61 to 84) or to any of the examples described herein, further comprising that the means for processing is configured to determine the performance-critical compute path of the compute kernel based on a control and data flow graph of the compute kernel, with vertices of the control and data flow graph representing the computational instructions and edges of the control and data flow graph representing the interdependence between the computational instructions.

Another example (e.g., example 86) relates to a previously described example (e.g., example 85) or to any of the examples described herein, further comprising that each group of computational instructions has a single control flow entry and a single control flow exit point.

Another example (e.g., example 87) relates to a previously described example (e.g., one of the examples 85 to 86) or to any of the examples described herein, further comprising that the means for processing is configured to generate the control and data flow graph based on the compute kernel.

Another example (e.g., example 88) relates to a previously described example (e.g., one of the examples 61 to 87) or to any of the examples described herein, further comprising that the plurality of units of computing circuitry comprise units of computing circuitry of at least two different processing units of a computer system.

Another example (e.g., example 89) relates to a previously described example (e.g., one of the examples 61 to 88) or to any of the examples described herein, further comprising that the plurality of units of computing circuitry comprise units of computing circuitry of at least two different processing units of at least two different computer systems.

An example (e.g., example 90) relates to a computer system comprising the device according to one of the examples 61 to 89.

An example (e.g., example 91) relates to a method comprising determining (130) a performance-critical compute path of a compute kernel to be executed on a plurality of units of computing circuitry of a computing architecture, the compute kernel comprising a plurality of interdependent groups of computational instructions, with the performance-critical compute path being based on a subset of the interdependent groups of computational instructions. The method comprises determining (160) for at least one group of computational instructions outside the performance-critical compute path, a reduced clock frequency being lower than a maximally feasible clock frequency of the respective group of computational instructions. The method comprises generating (170) logic to be performed by one or more of the plurality of separately controllable units of computing circuitry based on the compute kernel, wherein a portion of the logic that is generated to be performed by the plurality of separately controllable units of computing circuitry outside the performance-critical compute path is generated based at least in part on the reduced clock frequency.

Another example (e.g., example 92) relates to a previously described example (e.g., example 91) or to any of the examples described herein, further comprising that the plurality of units of computing circuitry are separately controllable at least with respect to a clock frequency being used to operate the respective unit of computing circuitry.

Another example (e.g., example 93) relates to a previously described example (e.g., one of the examples 91 to 92) or to any of the examples described herein, further comprising that the plurality of units of computing circuitry of the computing architecture comprises a plurality of logic tiles of a field-programmable gate array, with the plurality of logic tiles being operable at different clock frequencies.

Another example (e.g., example 94) relates to a previously described example (e.g., example 93) or to any of the examples described herein, further comprising that the method comprises generating the logic such, that logic tiles used for executing the at least one group of computational instructions outside the performance-critical compute path are operated based on the reduced clock frequency.

Another example (e.g., example 95) relates to a previously described example (e.g., one of the examples 93 to 94) or to any of the examples described herein, further comprising that the method comprises synthesizing (190) a bit stream for programming the plurality of logic tiles of the field-programmable gate array based on the logic.

Another example (e.g., example 96) relates to a previously described example (e.g., one of the examples 93 to 95) or to any of the examples described herein, further comprising that the act of determining the reduced clock frequency comprises determining (161) an initial reduced clock frequency, performing (176) place and route operations for the logic based on the initial reduced clock frequency, and determining the reduced clock frequency based on an output of the place and route operations.

Another example (e.g., example 97) relates to a previously described example (e.g., one of the examples 93 to 96) or to any of the examples described herein, further comprising that the method comprises using (171) registers being used for pipelining into the logic based on the reduced clock frequency.

Another example (e.g., example 98) relates to a previously described example (e.g., one of the examples 93 to 97) or to any of the examples described herein, further comprising that the method comprises generating the logic as code according to a hardware description language.

Another example (e.g., example 99) relates to a previously described example (e.g., one of the examples 93 to 98) or to any of the examples described herein, further comprising that the method comprises using (172) at least one of one or more clock dividers and one or more clock multipliers for the logic based on the reduced clock frequency.

Another example (e.g., example 100) relates to a previously described example (e.g., example 99) or to any of the examples described herein, further comprising that the method comprises using (172) at least one of one or more configurable clock dividers and one or more configurable clock multipliers for the logic based on the reduced clock frequency.

Another example (e.g., example 101) relates to a previously described example (e.g., example 100) or to any of the examples described herein, further comprising that the method comprises using (173) logic for monitoring the execution of the at least one group of computational instructions outside the performance-critical compute path and using (174) logic for configuring the one of one or more configurable clock dividers and/or one or more configurable clock multipliers based on the monitoring.

Another example (e.g., example 102) relates to a previously described example (e.g., one of the examples 93 to 101) or to any of the examples described herein, further comprising that the method comprises specifying (180) at least one phase-locked loop setting of the field-programmable gate array based on the reduced clock frequency.

Another example (e.g., example 103) relates to a previously described example (e.g., one of the examples 93 to 102) or to any of the examples described herein, further comprising that the method comprises using (173) logic for monitoring the execution of the at least one group of computational instructions outside the performance-critical compute path and using (175) logic for controlling a phase-locked loop setting of the field-programmable gate array based on the monitoring.

Another example (e.g., example 104) relates to a previously described example (e.g., one of the examples 91 to 103) or to any of the examples described herein, further comprising that the method comprises determining the reduced clock frequency with a constraint regarding a number of different reduced clock frequencies.

Another example (e.g., example 105) relates to a previously described example (e.g., one of the examples 91 to 104) or to any of the examples described herein, further comprising that the method comprises determining the reduced clock frequency based on static analysis of a control and data flow graph representing the compute kernel.

Another example (e.g., example 106) relates to a previously described example (e.g., one of the examples 91 to 105) or to any of the examples described herein, further comprising that the method comprises determining the reduced clock frequency based on an emulation of the compute kernel.

Another example (e.g., example 107) relates to a previously described example (e.g., one of the examples 91 to 106) or to any of the examples described herein, further comprising that the method comprises determining the reduced clock frequency based on an execution of the compute kernel on the plurality of units of computing circuitry.

Another example (e.g., example 108) relates to a previously described example (e.g., one of the examples 91 to 107) or to any of the examples described herein, further comprising that the reduced frequency is determined such, that a first clock frequency of a first group of computational instructions being on the performance-critical compute path and a second reduced clock frequency of a second group of computational instructions being outside the performance-critical compute path is derived from a frequency of a phase-locked loop commonly used by the first and second group of computational instructions.

Another example (e.g., example 109) relates to a previously described example (e.g., one of the examples 91 to 108) or to any of the examples described herein, further comprising that the reduced clock frequency is generated such, that a reduction of performance of the overall compute kernel due to the reduced frequency is avoided.

Another example (e.g., example 110) relates to a previously described example (e.g., one of the examples 91 to 109) or to any of the examples described herein, further comprising that the performance of the performance-critical compute path and/or of an overall compute kernel relates to at least one of a latency, a throughput, and a power consumption.

Another example (e.g., example 111) relates to a previously described example (e.g., one of the examples 91 to 110) or to any of the examples described herein, further comprising that the reduced clock frequency is generated such, that a time required for executing groups of computational instructions being executed in parallel is balanced.

Another example (e.g., example 112) relates to a previously described example (e.g., one of the examples 91 to 111) or to any of the examples described herein, further comprising that the method comprises identifying (140) at least one second group of computational instructions that is used once or less frequently than other groups of computational instructions, and to generate the logic such, that a second portion of the logic that is based on the at least one second group of computational instructions is clock-gated.

Another example (e.g., example 113) relates to a previously described example (e.g., one of the examples 91 to 112) or to any of the examples described herein, further comprising that the method comprises identifying (150) at least one third group of computational instructions that is configured to generate an updated output less frequently than other groups of computational instructions, and to generate the logic such, that a third portion of the logic that is based on the at least one third group of computational instructions is clock-gated.

Another example (e.g., example 114) relates to a previously described example (e.g., one of the examples 91 to 113) or to any of the examples described herein, further comprising that the method comprises generating (110) the compute kernel by compiling code of a high-level programming language, wherein compiling the code comprises moving one or more computational instructions from a group of computational instructions being part of the performance-critical compute path to another group of computational instructions being outside of the performance-critical compute path.

Another example (e.g., example 115) relates to a previously described example (e.g., one of the examples 91 to 114) or to any of the examples described herein, further comprising that the method comprises determining the performance-critical compute path of the compute kernel based on a control and data flow graph of the compute kernel, with vertices of the control and data flow graph representing the computational instructions and edges of the control and data flow graph representing the interdependence between the computational instructions.

Another example (e.g., example 116) relates to a previously described example (e.g., example 115) or to any of the examples described herein, further comprising that each group of computational instructions has a single control flow entry and a single control flow exit point.

Another example (e.g., example 117) relates to a previously described example (e.g., one of the examples 115 to 116) or to any of the examples described herein, further comprising that the method comprises generating (120) the control and data flow graph based on the compute kernel.

Another example (e.g., example 118) relates to a previously described example (e.g., one of the examples 91 to 117) or to any of the examples described herein, further comprising that the plurality of units of computing circuitry comprise units of computing circuitry of at least two different processing units of a computer system.

Another example (e.g., example 119) relates to a previously described example (e.g., one of the examples 91 to 118) or to any of the examples described herein, further comprising that the plurality of units of computing circuitry comprise units of computing circuitry of at least two different processing units of at least two different computer systems.

An example (e.g., example 120) relates to a computer system being configured to perform the method according to one of the examples 91 to 119.

An example (e.g., example 121) relates to a non-transitory machine-readable storage medium including program code, when executed, to cause a machine to perform the method of one of the examples 91 to 119.

An example (e.g., example 122) relates to a computer program having a program code for performing the method of one of the examples 91 to 119 when the computer program is executed on a computer, a processor, or a programmable hardware component.

An example (e.g., example 123) relates to a machine-readable storage including machine readable instructions, when executed, to implement a method or realize an apparatus as claimed in any pending claim or shown in any example.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors, or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations, or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process, or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

As used herein, the term "module" refers to logic that may be implemented in a hardware component or device, software or firmware running on a processing unit, or a combination thereof, to perform one or more operations consistent with the present disclosure. Software and firmware may be embodied as instructions and/or data stored on non-transitory computer-readable storage media. As used herein, the term "circuitry" can comprise, singly or in any combination, non-programmable (hardwired) circuitry, programmable circuitry such as processing units, state machine circuitry, and/or firmware that stores instructions executable by programmable circuitry. Modules described herein may, collectively or individually, be embodied as circuitry that forms a part of a computing system. Thus, any of the modules can be implemented as circuitry. A computing system referred to as being programmed to perform a method can be programmed to perform the method via software, hardware, firmware, or combinations thereof.

Any of the disclosed methods (or a portion thereof) can be implemented as computer-executable instructions or a computer program product. Such instructions can cause a computing system or one or more processing units capable of executing computer-executable instructions to perform any of the disclosed methods. As used herein, the term "computer" refers to any computing system or device described or mentioned herein. Thus, the term "computer-executable instruction" refers to instructions that can be executed by any computing system or device described or mentioned herein.

The computer-executable instructions can be part of, for example, an operating system of the computing system, an application stored locally to the computing system, or a remote application accessible to the computing system (e.g., via a web browser). Any of the methods described herein can be performed by computer-executable instructions performed by a single computing system or by one or more networked computing systems operating in a network environment. Computer-executable instructions and updates to the computer-executable instructions can be downloaded to a computing system from a remote server.

Further, it is to be understood that implementation of the disclosed technologies is not limited to any specific computer language or program. For instance, the disclosed technologies can be implemented by software written in C++, C#, Java, Perl, Python, JavaScript, Adobe Flash, C#, assembly language, or any other programming language. Likewise, the disclosed technologies are not limited to any particular computer system or type of hardware.

Furthermore, any of the software-based examples (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, cable (including fiber optic cable), magnetic communications, electromagnetic communications (including RF, microwave, ultrasonic, and infrared communications), electronic communications, or other such communication means.

The disclosed methods, apparatuses, and systems are not to be construed as limiting in any way. Instead, the present disclosure is directed toward all novel and nonobvious features and aspects of the various disclosed examples, alone and in various combinations and subcombinations with one another. The disclosed methods, apparatuses, and systems are not limited to any specific aspect or feature or combination thereof, nor do the disclosed examples require that any one or more specific advantages be present, or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An apparatus comprising interface circuitry, machine-readable instructions and processing circuitry to execute the machine-readable instructions to:

determine a performance-critical compute path of a compute kernel to be executed on a plurality of units of computing circuitry of a computing architecture, the compute kernel comprising a plurality of interdependent groups of computational instructions, with the performance-critical compute path being based on a subset of the interdependent groups of computational instructions;

determine, for at least one group of computational instructions outside the performance-critical compute path, a reduced clock frequency being lower than a maximally feasible clock frequency of the respective group of computational instructions; and generate logic to be performed by one or more of the plurality of units of computing circuitry based on the compute kernel, wherein a portion of the logic that is generated to be performed by the plurality of units of computing circuitry outside the performance-critical compute path is generated based at least in part on the reduced clock frequency, wherein the plurality of units of computing circuitry of the computing architecture comprises a plurality of logic tiles of a field-programmable gate array, with the plurality of logic tiles being operable at different clock frequencies.

2. The apparatus according to claim 1, wherein the machine-readable instructions comprise instructions to generate the logic such, that logic tiles used for executing the at least one group of computational instructions outside the performance-critical compute path are operated based on the reduced clock frequency.

3. The apparatus according to claim 1, wherein the machine-readable instructions comprise instructions to synthesize a bit stream for programming the plurality of logic tiles of the field-programmable gate array based on the logic.

4. The apparatus according to claim 1, wherein the act of determining the reduced clock frequency comprises determining an initial reduced clock frequency, performing place and route operations for the logic based on the initial reduced clock frequency, and determining the reduced clock frequency based on an output of the place and route operations.

5. The apparatus according to claim 1, wherein the machine-readable instructions comprise instructions to insert registers being used for pipelining into the logic based on the reduced clock frequency.

6. The apparatus according to claim 1, wherein the machine-readable instructions comprise instructions to generate the logic as code according to a hardware description language.

7. The apparatus according to claim 1, wherein the machine-readable instructions comprise instructions to determine the reduced clock frequency with a constraint regarding a number of different reduced clock frequencies.

8. The apparatus according to claim 1, wherein the machine-readable instructions comprise instructions to determine the reduced clock frequency based on static analysis of a control and data flow graph representing the compute kernel.

9. The apparatus according to claim 1, wherein the machine-readable instructions comprise instructions to determine the reduced clock frequency based on an emulation of the compute kernel.

10. The apparatus according to claim 1, wherein the machine-readable instructions comprise instructions to determine the reduced clock frequency based on an execution of the compute kernel on the plurality of units of computing circuitry.

11. The apparatus according to claim 1, wherein the reduced frequency is determined such, that a first clock frequency of a first group of computational instructions being on the performance-critical compute path and a second reduced clock frequency of a second group of computational instructions being outside the performance-critical compute path is derived from a frequency of a phase-locked loop commonly used by the first and second group of computational instructions.

12. The apparatus according to claim 1, wherein the reduced clock frequency is generated such, that a reduction of performance of the overall compute kernel due to the reduced frequency is avoided.

13. The apparatus according to claim 1, wherein the performance of the performance-critical compute path and/ or of an overall compute kernel relates to at least one of a latency, a throughput, and a power consumption.

14. The apparatus according to claim 1, wherein the reduced clock frequency is generated such, that a time required for executing groups of computational instructions being executed in parallel is balanced.

15. The apparatus according to claim 1, wherein the machine-readable instructions comprise instructions to identify at least one second group of computational instructions that is used once or less frequently than other groups of computational instructions, and to generate the logic such, that a second portion of the logic that is based on the at least one second group of computational instructions is clock-gated.

16. The apparatus according to claim 1, wherein the machine-readable instructions comprise instructions to identify at least one third group of computational instructions that is configured to generate an updated output less frequently than other groups of computational instructions, and to generate the logic such, that a third portion of the logic that is based on the at least one third group of computational instructions is clock-gated.

17. The apparatus according to claim 1, wherein the machine-readable instructions comprise instructions to generate the compute kernel by compiling code of a high-level programming language, wherein compiling the code comprises moving one or more computational instructions from a group of computational instructions being part of the performance-critical compute path to another group of computational instructions being outside of the performance-critical compute path.

18. The apparatus according to claim 1, wherein the machine-readable instructions comprise instructions to determine the performance-critical compute path of the compute kernel based on a control and data flow graph of the compute kernel, with vertices of the control and data flow graph representing the computational instructions and edges of the control and data flow graph representing the interdependence between the computational instructions.

19. The apparatus according to claim 1, wherein the plurality of units of computing circuitry are separately controllable at least with respect to a clock frequency being used to operate the respective unit of computing circuitry.

20. The apparatus according to claim 1, wherein the plurality of units of computing circuitry comprise units of computing circuitry of at least two different processing units of a computer system.

21. The apparatus according to claim 1, wherein the plurality of units of computing circuitry comprise units of computing circuitry of at least two different processing units of at least two different computer systems.

22. A computer system comprising the apparatus according to claim 1.

23. A method comprising:

determining a performance-critical compute path of a compute kernel to be executed on a plurality of units of computing circuitry of a computing architecture, the compute kernel comprising a plurality of interdependent groups of computational instructions, with the performance-critical compute path being based on a subset of the interdependent groups of computational instructions;

determining for at least one group of computational instructions outside the performance-critical compute path, a reduced clock frequency being lower than a maximally feasible clock frequency of the respective group of computational instructions; and generating logic to be performed by one or more of the plurality of units of computing circuitry based on the compute kernel, wherein a portion of the logic that is generated to be performed by the plurality of units of computing circuitry outside the performance-critical compute path is generated based at least in part on the reduced clock frequency, wherein the plurality of units of computing circuitry of the computing architecture comprises a plurality of logic tiles of a field-programmable gate array, with the plurality of logic tiles being operable at different clock frequencies.

24. A non-transitory machine-readable storage medium including program code, when executed, to cause a machine to perform the method of claim 23.

* * * * *